(12) United States Patent
Morioka et al.

(10) Patent No.: US 8,137,460 B2
(45) Date of Patent: Mar. 20, 2012

(54) MANUFACTURING METHOD OF GAN THIN FILM TEMPLATE SUBSTRATE, GAN THIN FILM TEMPLATE SUBSTRATE AND GAN THICK FILM SINGLE CRYSTAL

(75) Inventors: Satoru Morioka, Toda (JP); Misao Takakusaki, Toda (JP); Takayuki Shimizu, Toda (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 83 days.

(21) Appl. No.: 12/441,483

(22) PCT Filed: Sep. 14, 2007

(86) PCT No.: PCT/JP2007/067942
§ 371 (c)(1),
(2), (4) Date: Mar. 16, 2009

(87) PCT Pub. No.: WO2008/035632
PCT Pub. Date: Mar. 27, 2008

(65) Prior Publication Data
US 2009/0294774 A1 Dec. 3, 2009

(30) Foreign Application Priority Data
Sep. 20, 2006 (JP) .................................. 2006-253797

(51) Int. Cl.
*H01L 21/20* (2006.01)
*H01L 21/36* (2006.01)
(52) U.S. Cl. ......................................... 117/99; 438/483
(58) Field of Classification Search .................. 438/483; 117/99; 257/E29.089
See application file for complete search history.

(56) References Cited

U.S. PATENT DOCUMENTS
5,716,450 A  2/1998  Togawa et al.
(Continued)

FOREIGN PATENT DOCUMENTS
EP  1 246 233 A2  10/2002
(Continued)

OTHER PUBLICATIONS

Kumagai et al., "Thick and high-quality GaN growth on GaAs (111) substrates for preparation of freestanding GaN." Journal of Crystal Growth, 246, (2002), pp. 215-222.
(Continued)

*Primary Examiner* — William M. Brewster
(74) *Attorney, Agent, or Firm* — Birch, Stewart, Kolasch & Birch, LLP

(57) ABSTRACT

Provided are a manufacturing method of a GaN single crystal in which the film thickness of the GaN single crystal can be controlled accurately, even when a hydride vapor phase epitaxy is applied; a GaN thin film template substrate which is suitable for growing a GaN thick film with a fine property; and a GaN single crystal growing apparatus. Provided is a manufacturing method of a GaN single crystal by a hydride vapor phase epitaxy, wherein the hydride vapor phase epitaxy comprises: spraying HCl (hydrogen chloride) onto Ga (gallium) which is heated and fused in a predetermined temperature to generate GaCl (gallium chloride); and forming a GaN thin film by a reaction of the generated GaCl (gallium chloride) with $NH_3$ (ammonia) gas which is hydroxide gas on a substrate, the manufacturing method comprising supplying the $NH_3$ gas in a vicinity of the substrate (for example, at a position which is separated from the substrate by a distance of 0.7-4.0 times as longer than a diameter of the substrate) through a nozzle. Further, as the substrate, an NGO(011) substrate in which the lattice constant thereof is similar to that of GaN is used.

9 Claims, 3 Drawing Sheets

U.S. PATENT DOCUMENTS

| | | | |
|---|---|---|---|
| 2003/0045103 A1* | 3/2003 | Suzuki et al. | 438/689 |
| 2006/0236923 A1* | 10/2006 | Kouvetakis et al. | 117/108 |
| 2010/0147211 A1* | 6/2010 | Miyanaga et al. | 117/84 |

FOREIGN PATENT DOCUMENTS

| | | |
|---|---|---|
| EP | 1 480 260 A1 | 11/2004 |
| JP | 8-186078 A | 7/1996 |
| JP | 8-186329 A | 7/1996 |
| JP | 8-208385 A | 8/1996 |
| JP | 9-71496 A | 3/1997 |
| JP | 10-256662 A | 9/1998 |
| JP | 3263891 B2 | 12/2001 |
| JP | 3293035 B2 | 4/2002 |
| JP | 2002-305155 A | 10/2002 |
| JP | 3564645 B2 | 6/2004 |
| JP | 2005-1928 A | 1/2005 |
| JP | 3692452 B2 | 7/2005 |

OTHER PUBLICATIONS

A. Kasic et al.; Highly homogeneous bulk-like 2" GaN grown by HVPE on MOCVD-GaN template; Journal of Crystal Growth; No. 275; pp. 387-393; 2005.

D. Martin et al.; High quality thin GaN templates grown by hydride vapor phase epitaxy on sapphire substrates; Applied Physics Letters; No. 68. 241914; 2006.

European Search Report dated Nov. 17, 2010 issued in corresponding EP application No. 07807346.7.

S.A. Safvi et al.; Effect of reactor geometry and growth parameters on the uniformity and material properies of GaN/sapphire grown by hydride vapor-phase epitaxy: Journal of Crystal Growth; No. 182, pp. 233-240; 1997.

* cited by examiner

XRD FULL WIDTH AT HALF MAXIMUM OF GaN THIN FILM

MANUFACTURING METHOD OF GAN THIN FILM TEMPLATE SUBSTRATE, GAN THIN FILM TEMPLATE SUBSTRATE AND GAN THICK FILM SINGLE CRYSTAL

TECHNICAL FIELD

The present invention relates to a manufacturing method of a GaN thin film template substrate, which is applied with a hydride vapor phase epitaxy, and also related to a GaN thin film template substrate and GaN thick film single crystal which are applied to manufacturing a light-emitting device such as a blue LED, and the like.

BACKGROUND ART

Conventionally, as one of the crystal growing methods, a hydride vapor phase epitaxy (HVPE) is known, in which by using a metallic chloride which is generated by a reaction of a heated metallic source material with a hydrogen chloride as source material gas, a crystal is grown from the chloride gas and hydroxide gas of a nonmetallic material.

FIG. 3 is a schematic configuration diagram showing the structure of a conventional vapor phase growing apparatus (an HVPE apparatus).

An HVPE apparatus 100 is configured with a reacting furnace 1 which is sealed, and resistance heaters 2 which are provided at an outer circumference of the reacting furnace 1. The reacting furnace 1 is provided with an HCl gas supplying pipe 6 to supply HCl gas to generate a group III source material gas; a group V source material gas supplying pipe 7 to supply group V source material gas such as $NH_3$ gas, and the like, into the reacting furnace; an $N_2$ gas supplying pipe 8 to supply $N_2$ gas into the reacting furnace; a gas discharging pipe 3; and a substrate holder 4 to place a substrate 11.

Further, a source material placing section 10 is provided in the HCl gas supplying pipe 6, and a metallic source material 9 is disposed at this section to generate the group III source material gas. Moreover, the group III source material gas which is generated by the reaction of the HCl gas with the metallic source material 9 is sprayed onto the substrate 11 through a supplying nozzle 12.

In a metal-organic vapor phase epitaxy (MOVPE), a cold-wall heating method is applied, in which only the circumference of the substrate is directly heated, and the wall temperature of the reacting furnace does not rise. On the other hand, as shown in FIG. 3, a hot-wall heating method is applied in the HVPE apparatus 100, in which the entire reacting furnace is heated. That is to say, the HVPE method is designed to heat an area from a source material section in which the metallic source material is provided, through a mixing section in which the source material gas is mixed, to a growing section in which the reaction is proceeded so as to grow the crystal. The HVPE method has an advantage in that the crystal can be grown in a relatively high speed by supplying the source material gas on a massive scale.

Generally, in a case where a crystal of a gallium nitride (GaN) is grown by applying the HVPE method, a gallium chloride (GaCl) which is generated by the reaction of a metallic gallium (Ga) with a hydrogen chloride (HCl) is used as the group III source material, and an ammonia ($NH_3$) is used as the group V source material. Here, the thermal decomposition rate of the ammonia is said to be a few %, which is lower compared to that of an arsine ($AsH_3$) which is used as the group V source material when a crystal of a gallium arsenide (GaAs) is grown, and to that of a phosphine ($PH_3$) which is used as the group V source material when a crystal of an indium phosphide (InP) is grown. Accordingly, it is inevitably necessary to enlarge the proportion of V/III which is the supplying proportion of group V source material to the group III source material, when the crystal of GaN single crystal is grown.

Consequently, when the crystal of GaN single crystal is grown by applying the HVPE method, the following reaction pipe configuration is employed, as shown in FIG. 3. That is, a massive $NH_3$ is gradually supplied from the group V source material gas supplying pipe 7, so as to be a laminar flow in the entire reacting furnace, and a small amount of GaCl which is generated by the reaction of the HCl with metallic Ga 9, is sprayed onto the substrate 11 in the growing section by the nozzle 12.

Further, Patent Documents 1-5 disclose that a rare earth group 3B perovskite substrate, especially an NGO substrate, is useful for the substrate for growing a GaN system compound semiconductor single crystal.

Patent Document 1: Japanese Patent Application Laid Open Publication No. 8-186329
Patent Document 2: Japanese Patent Application Laid Open Publication No. 8-186078 (Japanese Patent No. 3263891B)
Patent Document 3: Japanese Patent Application Laid Open Publication No. 8-208385 (Japanese Patent No. 3564645B)
Patent Document 4: Japanese Patent No. 3293035B
Patent Document 5: Japanese Patent Application Laid Open Publication No. 9-071496 (Japanese Patent No. 3692452B)
Non-Patent Document 1: Journal of Crystal Growth 246 (2002) 215-222

DISCLOSURE OF THE INVENTION

Problems to be Solved by the Invention

As described above, in a case where a crystal of GaN single crystal is grown by the conventional HVPE method, a massive $NH_3$ is gradually supplied in the entire reaction pipe so as to be a laminar flow. Accordingly, even when the supply of the source material gas is stopped so as to terminate the crystal growth, GaCl continues to flow out from the Ga surface for a while to react with the $NH_3$ which remains in the reaction pipe, thus GaN is generated. Therefore, it is difficult to accurately control the film thickness and the composition of the GaN single crystal. Incidentally, it is possible to accurately control the film thickness and the composition of the GaN single crystal in the HVPE method, by discharging the gas in the source material section using a vacuum pump, or the like. However, the apparatus becomes extremely complicated in this case.

As described above, it is difficult to accurately control the film thickness and the composition of the GaN single crystal to be grown in the HVPE method. Thus, the HVPE method has been considered to be unsuitable for manufacturing a GaN thin film template substrate in which an uniformity of film thickness and a high quality of the crystal are required. Accordingly, the GaN thin film template substrate which is currently offered commercially is manufactured mainly by the MBE method or by the MOVPE method.

By the way, in a case where the GaN thin film template substrate is manufactured by the above mentioned MBE method or the MOCVD method, a sapphire or the like, in which the lattice constant thereof greatly differs from that of GaN is used as the substrate crystal. In such a case, a GaN polycrystal which is referred to as a low temperature buffer layer is grown by approximately 100 nm at 500-600° C. on the sapphire substrate, and subsequently, a GaN single crystal is grown by a few micrometers at approximately 1000° C. as a template layer, thus the GaN thin film template substrate is manufactured.

However, the above mentioned low temperature buffer layer cannot be subjected to XRD measurement in many cases due to being a polycrystal. Further, even when the low temperature buffer layer can be evaluated, a full width at half maximum thereof is tens of thousands of seconds (Non-Patent Document 1).

The object of the present invention is to provide a manufacturing method of GaN single crystal, in which the film thickness and the composition of the GaN single crystal can be accurately controlled even when the hydride vapor phase epitaxiy is applied, and to provide a GaN thin film template substrate which is suitable for growing a GaN thick film with fine property, and a GaN single crystal growing apparatus.

Means for Solving the Problem

The present invention is made in order to solve the above mentioned object, and provided is a manufacturing method of a GaN single crystal by a hydride vapor phase epitaxy, wherein the hydride vapor phase epitaxy comprises: spraying HCl (hydrogen chloride) onto Ga (gallium) which is heated and fused in a predetermined temperature to generate GaCl (gallium chloride); and forming a GaN thin film by a reaction of the generated GaCl (gallium chloride) with $NH_3$ (ammonia) which is hydroxide gas on a substrate, the manufacturing method comprising supplying the $NH_3$ gas in a vicinity of the substrate through a nozzle. Here, the nozzle means a member to squirt fluid at a high speed, and the shape thereof is not particularly limited. Generally, a cylindrical one with a thinned end, or the like, is applied.

That is to say, by employing the configuration in which the $NH_3$ which is a group V source material is supplied by the nozzle, the starting and stopping of the $NH_3$ supply can be performed instantly, and the $NH_3$ remaining in the reacting furnace after the $NH_3$ supply is stopped is to be reduced.

To put it concretely, the $NH_3$ gas is supplied at a position which is separated from the substrate by a distance of 0.7-4.0 times as longer than a diameter of the substrate. That is to say, the nozzle to supply the $NH_3$ gas is disposed so that the substrate and the nozzle end are separated from each other by the distance of 0.7-4.0 times as longer than the diameter of the substrate.

Further, as the substrate, an NGO(011) substrate in which the lattice constant thereof is similar to that of GaN is used. Thereby, a GaN single crystal with high quality, in which for example, the full width at half maximum by the XRD measurement is not more than 1000 seconds, more preferably, the full width at half maximum is not more than 500 seconds, and even more preferably, the full width at half maximum is not more than 200 seconds, can be grown.

Further, the GaN single crystal growing apparatus (100) according to the present invention, comprises: a reacting furnace (1) which is sealed; a resistance heater (2) which is provided at an outer circumference of the reacting furnace; a GaCl gas supplying section (7, 10) to supply GaCl gas as group III source material gas from a supply port into the reacting furnace; an $NH_3$ gas supplying section (5, 6) to supply $NH_3$ gas as group V source material gas from a supplying nozzle into the reacting furnace; an $N_2$ gas supplying section (8) to supply $N_2$ gas into the reacting furnace; a gas discharging section (3); and a substrate holder (4) to place a substrate, wherein an end of the supplying nozzle is located closer to the substrate than the supply port of the group III source material gas supplying section.

Effect of the Invention

According to the present invention, the GaN single crystal is grown on the NGO(011) substrate, and subsequently, the supply of the source material gas is stopped instantly, thus superfluous $NH_3$ can be prevented from remaining in the reacting furnace. Thereby, even when GaCl flows out from the surface of the Ga source material, reaction with $NH_3$ does not happen after the supply of the source material gas is stopped. Accordingly, the growth of the GaN single crystal can reliably be prevented from proceeding, and the film thickness of the GaN single crystal can be controlled extremely accurately (for example, in a nanometer order) even when the HVPE method is applied. Further, because the HVPE method is applied, the GaN single crystal can be grown in a relatively high speed, and the manufacturing cost of the GaN single crystal can be reduced.

Moreover, in the GaN thin film template which can be obtained by the above described manufacturing method, the full width at half maximum by the XRD measurement is to be not more than 1000 seconds, thus the GaN thin film template can stably exist even when heated to approximately 1000° C. which is a general growing temperature of the GaN single crystal. As a result, a GaN thick film with high quality can be formed by using the GaN thin film template, thus can realize a light-emitting device such as a blue LED, and the like, with excellent property.

BEST MODE FOR CARRYING OUT THE INVENTION

Hereinbelow, a preferred embodiment will be explained with reference to the drawings.

Figure 1:
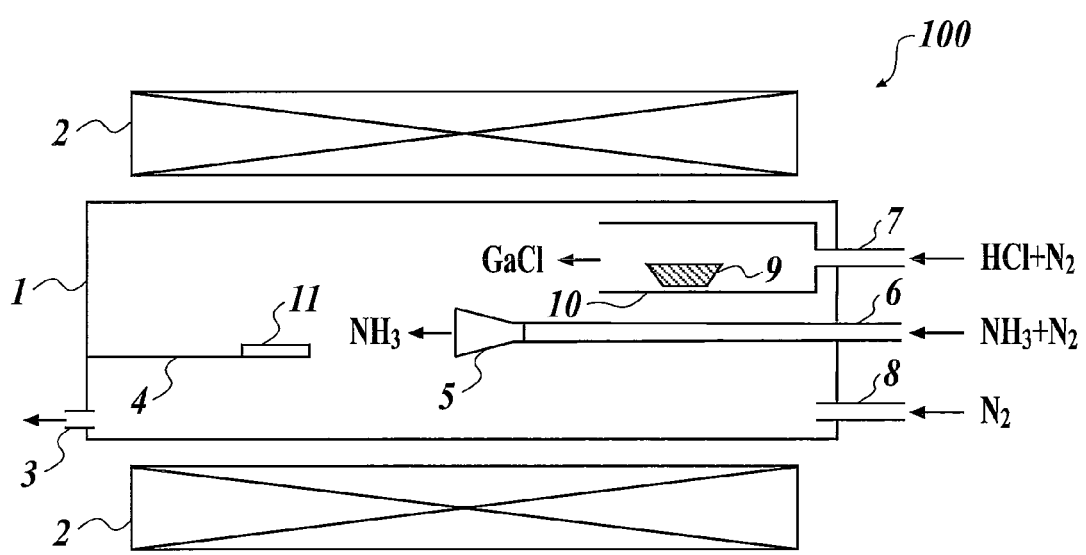
FIG. 1 This is a schematic configuration diagram showing a structure of a vapor phase growing apparatus (an HVPE apparatus) according to an embodiment.

FIG. 1 is a schematic configuration diagram showing the structure of a vapor phase growing apparatus (an HVPE apparatus) according to the embodiment.

The HVPE apparatus 100 is configured with a reacting furnace 1 which is sealed, and resistance heaters 2 which are provided at an outer circumference of the reacting furnace 1. The reacting furnace 1 is provided with an HCl gas supplying pipe 7 to supply HCl gas to generate a group III source material gas; a group V source material gas supplying pipe 6 to supply group V source material gas such as $NH_3$ gas, and the like, into the reacting furnace; an $N_2$ gas supplying pipe 8 to supply $N_2$ gas into the reacting furnace; a gas discharging pipe 3; and a substrate holder 4 to place a substrate 11.

A source material placing section 10 is provided in the HCl gas supplying pipe 7, and a metallic source material 9 is disposed at this section to generate the group III source material gas. Moreover, in the present embodiment, a supplying nozzle 5 is provided at the end of the group V source material gas supplying pipe 6, so that the NH₃ gas is sprayed onto the substrate 11 through the supplying nozzle 5.

Here, the supplying nozzle 5 is provided so that the end thereof is closer to the substrate than the supply port provided at the source material placing section 10. For example, the supplying nozzle 5 is provided so that the substrate and the end of the supplying nozzle 5 are separated from each other by the distance of 0.7-4.0 times as longer than the diameter of the substrate.

Next, a case in which a GaN single crystal is grown by using the above described HVPE apparatus 100 is explained in detail.

In the present embodiment, an NGO(011) in which the lattice constant thereof is similar to that of GaN is used as the substrate for crystal growth. Further, the group III source material gas is GaCl which is generated from metallic Ga and HCl, and the group V source material gas is NH₃. Moreover, in the HVPE apparatus 100, the distance between the supplying nozzle 5 and the substrate 11 is 100 mm (which is 1.97 times as longer than the diameter of the substrate).

First, an ingot of the NGO(011) is sliced so as to make the substrate for the crystal growth. On this occasion, the diameter of the NGO substrate is 2 inches, and the thickness thereof is 350 μm.

Next, the NGO substrate is subjected to a mirror polish, and further subjected to the surface treatments in the following procedures as necessary. That is to say, the NGO substrate is performed with an ultrasonic cleansing by acetone, then by methanol for 5 minutes, respectively. Subsequently, the substrate is blown by nitrogen gas so as to blow off the droplets, then is dried naturally. Further, the substrate is subjected to an etching for 5 minutes by a sulfuric acid system etchant (for example, phosphoric acid:sulfuric acid=1:3 (proportion in volume), 80° C.)

Subsequently, after the NGO substrate 11 is disposed on a predetermined position of the substrate holder 4, the substrate temperature is increased to 600° C. in a state where N₂ gas is introduced thereto through the N₂ gas supplying pipe 8. Subsequently, HCl gas is introduced through the HCl gas supplying pipe 7, and GaCl is generated by the reaction of metallic Ga 9 with HCl, so as to supply the generated GaCl onto the NGO substrate 11. Further, NH₃ gas is supplied onto the NGO substrate 11 from the NH₃ gas supplying pipe 6 through the supplying nozzle 5. On this occasion, N₂ gas is applied as the carrier gas.

Further, the GaN compound semiconductor crystal is grown in a growth rate of approximately 0.72 μm/h in a state of controlling the gas introduction amount so that the partial pressure of GaCl be 0.002 atm, and the partial pressure of NH₃ be 0.066 atm, respectively.

In the present embodiment, the group V source material gas (NH₃) is supplied in the vicinity of the NGO(011) substrate 11 through the nozzle, thus the supply of the source material gas can instantly be stopped after the growth of the GaN single crystal is terminated. Thereby, the NH₃ can be prevented from remaining in the reacting furnace after the supply of the source material gas is stopped, and reaction does not happen even when GaCl flows out from the surface of the Ga source material. Thus, the growth of the GaN single crystal can reliably be prevented from proceeding after the supply of the source material gas is stopped.

Figure 3:
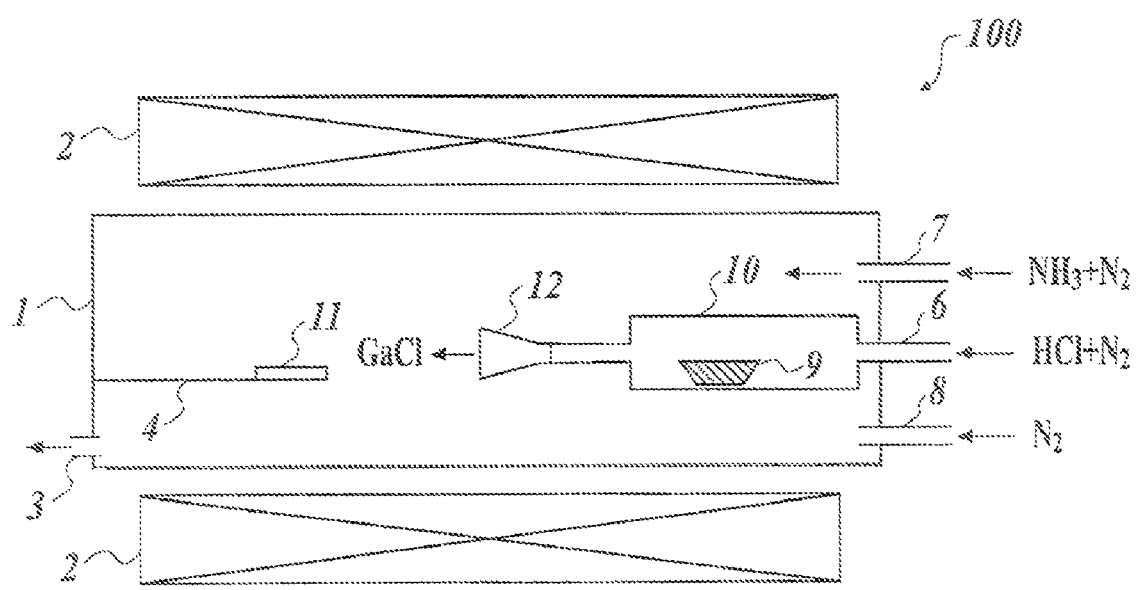
FIG. 3 This is a schematic configuration diagram showing a structure of a conventional vapor phase growing apparatus (an HVPE apparatus).

On the other hand, in the conventional apparatus configuration (see FIG. 3), even when the source material gas (HCl) is stopped, due to the GaCl which is supplied to just proximal to the substrate through the nozzle being small in flow amount, the remaining GaCl in the nozzle continues to flow out for a while, and it is difficult to stop the growth instantly.

Tables 1 and 2 show the measurement results of film thickness and full width at half maximum by XRD (X-ray diffraction) at 5 points in the wafer surface of the GaN single crystal thin film which is obtained by the above described manufacturing method. Incidentally, table 1 is a measurement result pertaining to GaN single crystal A which is grown in a state where the film thickness is controlled to be 60 nm, and table 2 is a measurement result pertaining to GaN single crystal B which is grown in a state where the film thickness is controlled to be 65 nm.

As shown in table 1, in GaN single crystal A, the difference between the maximum film thickness and the minimum film thickness is 4.298 nm, and error from the controlled film thickness is 1.677-2.621 nm. Further, as shown in table 2, in GaN single crystal B, the difference between the maximum film thickness and the minimum film thickness is 3.340 nm, and error from the controlled film thickness is 2.365-0.975 nm. From these results, it can be confirmed that the film thickness of GaN single crystal can be controlled accurately and uniformly in the manufacturing method applying the HVPE method.

Further, the full width at half maximum by the XRD of either of GaN single crystals A and B is not more than 200 seconds. Thereby, it can be said that the GaN single crystal thin film which is grown on the NGO(011) substrate is extremely superior in crystal property, thus is extremely effective as a GaN thin film template substrate for growing the GaN thick film.

As described above, in the present embodiment, because the NGO(011) substrate in which the lattice constant thereof is similar to that of GaN is used, a GaN single crystal with high quality can be grown. Further, the GaN single crystal is grown on the NGO substrate, and after the supply of the source material gas is stopped, the NH₃ can be prevented from remaining in the reacting furnace. Thus, even when GaCl flows out from the surface of the Ga source material, reaction does not happen. Accordingly, the growth of the GaN single crystal can reliably be prevented from proceeding after the source material gas is stopped, and the film thickness of GaN single crystal can be controlled extremely accurately even when HVPE method is applied.

TABLE 1

| GaN single crystal A | | |
| --- | --- | --- |
| MEASUREMENT POINT | XRD FULL WIDTH AT HALF MAXIMUM (seconds) | FILM THICKNESS (nm) |
| 1 | 159 | 58.323 |
| 2 | 162 | 61.869 |
| 3 | 146 | 62.621 |
| 4 | 151 | 59.527 |
| 5 | 151 | 58.407 |

TABLE 2

| GaN single crystal B | | |
| --- | --- | --- |
| MEASUREMENT POINT | XRD FULL WIDTH AT HALF MAXIMUM (seconds) | FILM THICKNESS (nm) |
| 1 | 162 | 63.664 |
| 2 | 184 | 65.975 |
| 3 | 153 | 65.299 |
| 4 | 148 | 65.064 |
| 5 | 151 | 62.635 |

Next, the above described GaN single crystal A (B) is used as the GaN thin film template substrate, and for example, GaN thick film is grown on the substrate by HVPE method by 500 μm. Table 3 shows the XRD property of the GaN thick film formed on the GaN thin film template substrate.

As shown in Table 3, by applying the GaN thin film template substrate which is obtained by the manufacturing method according to the present embodiment, the full width at half maximum by XRD of the grown GaN thick film can be controlled so as to be not more than 200 seconds. By the application of the GaN thick film having such XRD property, a light-emitting device such as a blue LED, and the like having an excellent property, can be realized.

TABLE 3

GaN single crystal grown with GaN single crystal A as a template substrate

| MEASUREMENT POINT | XRD FULL WIDTH AT HALF MAXIMUM (seconds) |
|---|---|
| 1 | 88 |
| 2 | 90 |
| 3 | 108 |
| 4 | 157 |
| 5 | 124 |

Figure 2:
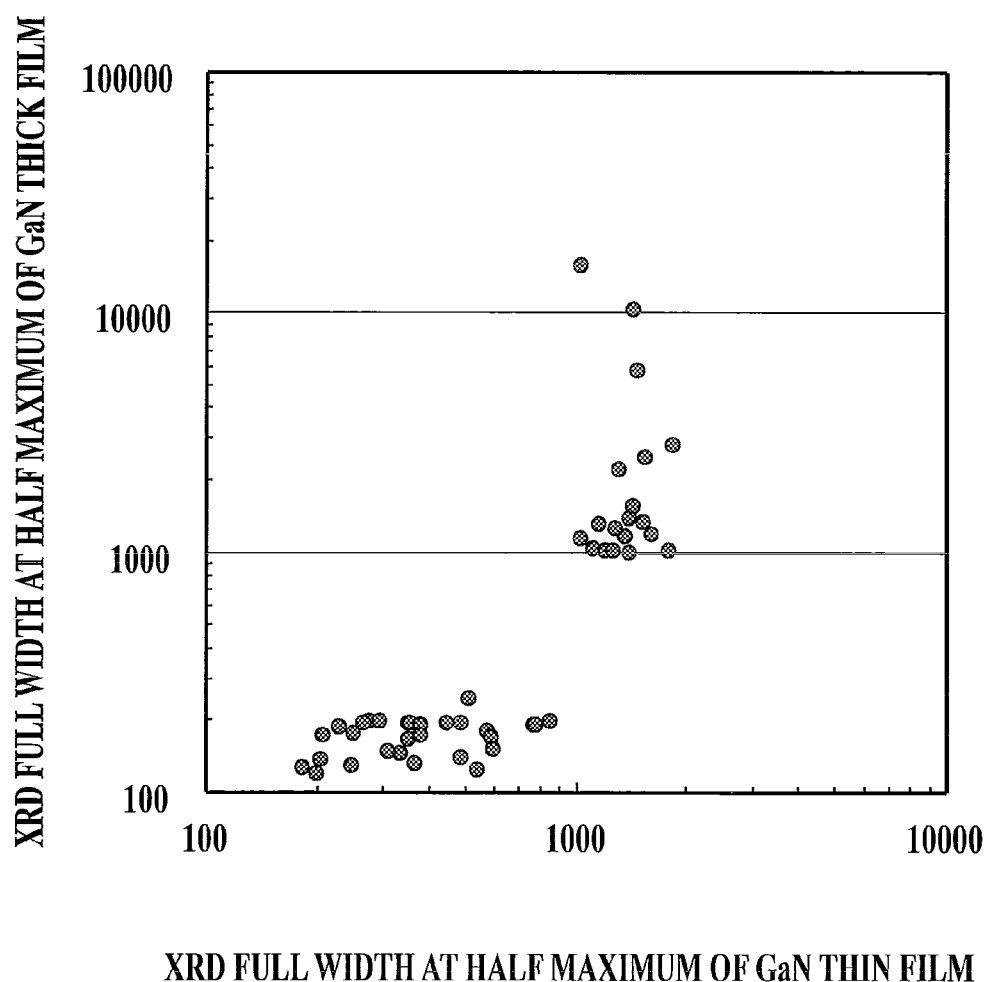
FIG. 2 This is an explanatory diagram showing a relationship between an XRD property of a thin film template substrate and an XRD property of a GaN thick film.

FIG. 2 shows the relationship between the XRD property of the thin film template substrate and the XRD property of the GaN thick film. As shown in FIG. 2, the property of GaN thick film is influenced by the property of the thin film template substrate.

To put it concretely, in order to obtain a GaN thick film with high quality (for example, XRD full width at half maximum of not more than 1000 seconds), it is required that the full width at half maximum of the thin film template substrate be not more than 1000 seconds. Preferably, when the full width at half maximum of the thin film template substrate is not more than 500 seconds, the XRD full width at half maximum of the GaN thick film can be not more than 250 seconds, and more preferably, when the XRD full width at half maximum of the thin film template substrate is not more than 200 seconds, the XRD full width at half maximum of the GaN thick film can be not more than 150 seconds.

As described above, the present invention made by the inventors is specifically described based on the embodiment. However, the present invention is not limited to the aforementioned embodiment.

For example, in the above mentioned embodiment, the distance between the supplying nozzle 5 and the substrate 11 is 100 mm (which is 1.97 times as longer as the diameter of the substrate). However, the similar effect can be obtained when the distance between the supplying nozzle 5 and the substrate 11 is set to be 0.7-4.0 times as longer as the diameter of the substrate.

Further, the present invention is not limited to the case in which the GaN single crystal is grown, but can also be applied to a case in which a group III-V compound semiconductor single crystal is grown by applying the HVPE method.

Further, the present invention is not limited to using the NGO substrate as the substrate for growth, but for example, a rare earth group 13 (3B) perovskite crystal, such as $NdAlO_3$, $NdInO_3$, and the like, may also be applied as the substrate.

Further, in the embodiment, the HVPE apparatus which is horizontal is explained, however, the similar effect can be obtained by supplying the group III source material gas (for example, GaCl) through a nozzle, in a vertical HVPE apparatus.

The invention claimed is:

1. A manufacturing method of a GaN thin film template substrate by a hydride vapor phase epitaxy, wherein
the hydride vapor phase epitaxy comprises:
spraying HCl (hydrogen chloride) onto Ga (gallium) which is heated and fused in a predetermined temperature to generate GaCl (gallium chloride); and
forming a GaN thin film by a reaction of the generated GaCl (gallium chloride) with $NH_3$ (ammonia) gas on a substrate,
the manufacturing method comprising supplying the $NH_3$ gas at a position which is separated from the substrate by a distance of 0.7-4.0 times as longer than a diameter of the substrate, in an upstream side of the substrate, inside of an atmosphere including the GaCl, through a nozzle, so that a film thickness can be controlled in a nanometer order,
wherein a tip of the nozzle through which the $NH_3$ gas is supplied is located closer to the substrate than a supply port of an $N_2$ gas supplying pipe from which an $N_2$ gas is supplied exclusively.

2. The manufacturing method of the GaN thin film template substrate as claimed in claim 1, wherein the substrate is an NGO(011) substrate.

3. A GaN thin film template substrate which is obtained by the manufacturing method as claimed in claim 1, wherein a full width at half maximum of the GaN thin film template substrate by an XRD measurement is not more than 1000 seconds.

4. The GaN thin film template substrate as claimed in claim 3, wherein the full width at half maximum by the XRD measurement is not more than 500 seconds.

5. The GaN thin film template substrate as claimed in claim 4, wherein the full width at half maximum by the XRD measurement is not more than 200 seconds.

6. A GaN thick film single crystal which is formed by an epitaxial growth by using the GaN thin film template substrate as claimed in claim 3 as the substrate, wherein the full width at half maximum by the XRD measurement is not more than 1000 seconds.

7. A GaN thick film single crystal which is formed by an epitaxial growth by using the GaN thin film template substrate as claimed in claim 4 as the substrate, wherein the full width at half maximum by the XRD measurement is not more than 1000 seconds.

8. The GaN thick film single crystal as claimed in claim 6 or 7, wherein the full width at half maximum by the XRD measurement is not more than 250 seconds.

9. The GaN thick film single crystal as claimed in claim 8, wherein the full width at half maximum by the XRD measurement is not more than 150 seconds.

* * * * *